(12) United States Patent
Xu et al.

(10) Patent No.: US 7,326,673 B2
(45) Date of Patent: Feb. 5, 2008

(54) TREATMENT OF SEMICONDUCTOR SUBSTRATES USING LONG-CHAIN ORGANOTHIOLS OR LONG-CHAIN ACETATES

(75) Inventors: Chongying Xu, New Milford, CT (US); David W. Minsek, Pleasantville, NY (US); Thomas H. Baum, New Fairfield, CT (US); Matthew Healy, Norwalk, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 431 days.

(21) Appl. No.: 10/303,450

(22) Filed: Nov. 25, 2002

(65) Prior Publication Data

US 2003/0125225 A1    Jul. 3, 2003

Related U.S. Application Data

(60) Provisional application No. 60/345,900, filed on Dec. 31, 2001.

(51) Int. Cl.
*C25F 3/30* (2006.01)
*C11D 3/34* (2006.01)
*C11D 3/30* (2006.01)

(52) U.S. Cl. ............... 510/175; 510/176; 510/254; 134/1.2; 134/1.3; 134/10; 134/11

(58) Field of Classification Search ........... 134/1.2, 134/1.3, 10, 11; 510/175, 176, 254
See application file for complete search history.

(56) References Cited

U.S. PATENT DOCUMENTS 4,882,107 A  * 11/1989 Cavender et al. ............. 264/51
5,866,005 A    2/1999 DeSimone et al.
5,868,862 A    2/1999 Douglas et al.
5,944,996 A    8/1999 DeSimone et al.
6,186,153 B1   2/2001 Kitsunai et al.
6,235,701 B1   5/2001 Senger Elsbernd
6,242,165 B1   6/2001 Vaartstra
6,270,531 B1   8/2001 DeYoung et al.
6,398,875 B1 * 6/2002 Cotte et al. ................. 134/2
6,425,956 B1 * 7/2002 Cotte et al. ................. 134/3
6,451,375 B1 * 9/2002 Cotte et al. ................ 427/58
6,500,605 B1  12/2002 Mullee et al.
6,509,141 B2   1/2003 Mullee
6,562,146 B1 * 5/2003 DeYoung et al. ........... 134/30
6,576,066 B1 * 6/2003 Namatsu .................... 134/30
6,596,093 B2 * 7/2003 DeYoung et al. ........... 134/36
6,602,349 B2 * 8/2003 Chandra et al. ............. 134/19
6,602,351 B2 * 8/2003 DeYoung et al. ........... 134/36
2002/0164873 A1 11/2002 Masuda et al.

FOREIGN PATENT DOCUMENTS

WO    96/27704   *  9/1996
WO    96/27704 B    9/1996

OTHER PUBLICATIONS

Advanced Technology Materials, Inc., International Application PCT/US05/012301, "International Search Report", Sep. 15, 2006.

* cited by examiner

*Primary Examiner*—Charles Boyer
(74) *Attorney, Agent, or Firm*—Chih-Sheng (Jason) Lin; Tristan A. Fuierer; Moore & Van Allen PLLC

(57) ABSTRACT

Chemical formulations and methods for removing unwanted material, such as unexposed photoresist, metal oxides, CMP residue, and the like, from semiconductor wafers or other substrates. The formulations utilize a supercritical fluid-based cleaning composition, which may further include (I) co-solvent(s), (II) surfactant(s), (III) chelating agent(s), and/or (IV) chemical reactant(s).

15 Claims, No Drawings

TREATMENT OF SEMICONDUCTOR SUBSTRATES USING LONG-CHAIN ORGANOTHIOLS OR LONG-CHAIN ACETATES

This application claims priority to U.S. Provisional Patent Application No. 60/345,900, filed on Dec. 31, 2001 in the name of Chongying Xu et al.

FIELD OF THE INVENTION

The present invention relates generally to chemical techniques used in semiconductor wafer fabrication, and particularly, to chemical formulations and methods using supercritical fluids to remove unwanted material such as photoresists, metal oxides and residues from semiconductor substrates during semiconductor wafer processing.

DESCRIPTION OF THE RELATED ART

Photolithography is used to structurally define the patterns of the layers and doping regions on semiconductor wafers. Photolithography techniques comprise the steps of coating, exposure, and development. Initially, a wafer is coated with a negative or positive photoresist substance and subsequently covered with a mask that defines specific areas to be either retained or removed in subsequent processes. Following the proper positioning of the mask, the photoresist layer (negative) is irradiated to harden the exposed photoresist material thereby making it resistant to removal and/or etching. The non-exposed photoresist material is then removed, or "developed," thereby leaving behind a pattern identical to the mask. Effective removal of the unwanted negative or positive photoresist is crucial because incomplete removal of the non-exposed photoresist residue affects subsequent processes and compromises the quality of the finished semiconductor device.

At present, the favored technique to remove the developed photoresist is plasma ashing. Plasma ashing involves exposing the photoresist-covered wafer to oxygen plasma in order to oxidatively decompose the unexposed photoresist film from the substrate surface. However, plasma etching usually results in the formation of plasma-etching residue, and this residue must subsequently be removed by wet chemical treatment. During wet chemical treatment, the wafer typically is exposed to solutions containing cleaning solvents and corrosion-inhibiting amines. Notably, it is difficult to balance effective plasma-etching residue removal and corrosion inhibition because the residue and the wafer layers tend to be similar materials. As such, unwanted removal of desired layers or corrosion of metal layers often occurs. Additionally, the use of copious amounts of cleaning agents and solvents presents environmental and safety issues and involves substantial costs for proper handling and disposal of these chemical reagents. On the other hand, when the device critical dimensions become very small, it is difficult for wet chemical to penetrate into deep trenches and vias because of the high surface tension. As a result, incomplete cleaning will occur. SCF has near zero surface tension and thus enables the complete cleaning for small dimension vias and trenches.

It therefore would be advantageous to provide a development process that effectively removes unwanted photoresist material and residue, without the disadvantages associated with conventional photoresist removal techniques.

More generally, it would be highly advantageous to provide a means and method for removal of unwanted material from a semiconductor wafer, e.g., photoresist, metal oxide, chemical mechanical planarization (CMP) residues, etc. during wafer processing.

SUMMARY OF THE INVENTION

The present invention relates to chemical formulations and methods for removing unwanted material, e.g., unexposed photoresist, metal oxides, CMP residues, etc., from semiconductor wafers. The formulations of the invention utilize a supercritical fluid (SCF), as hereinafter more fully described.

In one aspect, the invention relates to a cleaning formulation useful for removing unwanted material from a surface having such unwanted material thereon, said cleaning formulation comprising a supercritical fluid, at least one co-solvent, and at least one additional active agent.

Another aspect of the invention relates to a semiconductor wafer cleaning formulation useful to remove non-exposed photoresist from a semiconductor wafer surface having irradiated and non-irradiated photoresist regions thereon, such formulation comprising an additive or co-solvent in supercritical media.

A further aspect of the invention relates to a cleaning formulation for removing unwanted solid deposited material from a surface of a substrate having the unwanted solid deposited material thereon, such cleaning formulation comprising:

(I) a supercritical fluid comprising a fluid species selected from the group consisting of carbon dioxide, oxygen, argon, water, ammonia, and mixtures thereof; and (II) a co-solvent species selected from the group consisting of methanol, ethanol, and higher alcohols, N-alkylpyrrolidones, e.g., N-methyl-, N-octyl-, or N-phenylpyrrolidones, dimethylsulfoxide, sulfolane, catechol, ethyl lactate, acetone, butyl carbitol, monoethanolamine, butyrol lactone, diglycol amine, alkyl ammonium fluoride, γ-butyrolactone, butylene carbonate, ethylene carbonate, and propylene carbonate.

In yet another aspect, the invention relates to a method for fabricating a semiconductor wafer. The method comprises the removal of unwanted material from the surface of the wafer with a cleaning formulation comprising a supercritical fluid, at least one co-solvent, and at least one additional active agent.

A still further aspect of the invention relates to a method of removing non-exposed photoresist from a semiconductor wafer surface having irradiated and non-irradiated photoresist regions thereon, comprising contacting the semiconductor wafer surface with an additive or co-solvent in supercritical media.

The invention in another aspect relates to drying of exposed and aqueous developed photoresist patterns without image collapse or degradation.

In another aspect, the invention relates to a method for removing unwanted solid deposited material from a surface of a substrate having the unwanted solid deposited material thereon, comprising contacting the substrate surface with a cleaning formulation comprising (I) a supercritical fluid comprising a fluid species selected from the group consisting of carbon dioxide, oxygen, argon, krypton, xenon, ammonia, and mixtures thereof, and (II) a co-solvent species selected from the group consisting of methanol, ethanol, and higher alcohols, N-alkylpyrrolidones, such as N-methyl-, N-octyl-, or N-phenylpyrrolidones, dimethylsulfoxide, sulfolane, catechol, ethyl lactate, acetone, butyl carbitol, monoethanolamine, butyrol lactone, diglycol amine, alkyl ammonium fluoride, γ-butyrolactone, butylene carbonate, ethylene carbonate, and propylene carbonate.

Another aspect of the invention relates to a method of integrated circuit (IC) manufacture on a semiconductor substrate, comprising cleaning the semiconductor substrate to remove organic and/or inorganic material present thereon, wherein such cleaning comprises contacting the semiconductor substrate with a supercritical fluid-based cleaning composition including at least one of (I) co-solvent(s), (II) surfactant(s), (III) chelating agent(s), and (IV) chemical reactant(s).

A further method aspect of the invention relates to a method of integrated circuit (IC) manufacture on a semiconductor substrate, comprising cleaning the semiconductor substrate to remove organic and/or inorganic material present thereon, wherein such cleaning comprises contacting the semiconductor substrate with a supercritical fluid-based cleaning composition to permeate same into the material, and heating the semiconductor substrate to induce removal of the material therefrom by the action of the supercritical fluid-based cleaning composition.

Another aspect of the invention relates to a method of integrated circuit (IC) manufacture on a semiconductor substrate, comprising cleaning the semiconductor substrate to remove organic and/or inorganic material present thereon, wherein such cleaning comprises contacting the semiconductor substrate with a supercritical fluid-based cleaning composition in a pulsed mode of operation involving intermittent administration of energy to the cleaning composition on the semiconductor substrate.

A further aspect of the invention relates to a method of removing non-irradiated photoresist from a semiconductor wafer surface having irradiated and non-irradiated photoresist regions thereon, comprising contacting the semiconductor wafer surface with an etching agent in the presence of a supercritical fluid.

The invention further relates to a method of removing water or drying a lithographic pattern, after exposure and aqueous development, without image collapse or degradation.

In another method aspect, the invention relates to a method of cleaning a printed circuit board of unwanted metal oxides thereon, comprising contacting the printed circuit board surface and/or contact vias with a cleaning formulation comprising an acid dissolved in a supercritical fluid.

The invention relates in a further aspect to a method of cleaning a surface of unwanted material deposited thereon, comprising contacting the surface with a cleaning formulation comprising a reducing agent in a supercritical fluid.

A further aspect of the invention relates to a method of surface treatment of a substrate to produce a modified surface amenable to further processing, such method comprising contacting the substrate surface with a modifying composition comprising a supercritical fluid and at least one surface-modifying component effective to change the chemical properties of the substrate surface, or to protect underlying material or structure associated with such substrate surface.

A still further aspect of the invention relates to a surface modification composition for modifying the chemical properties of a substrate surface or to protect underlying material or structure associated with the substrate surface, said composition comprising an SCF and a long-chain organic material.

A further aspect of the invention relates to a method of removing water from a substrate after development of aqueous developed photoresist thereon, without image collapse or degradation, comprising contacting the substrate with a cleaning composition containing a supercritical fluid and at least one additional component selected from the group consisting of co-solvent(s), active agent(s), surfactant (s) and chelating agent(s).

In another aspect, the invention relates to a composition comprising $CO_2$ and at one semiconductor processing etchant, wherein said $CO_2$ and said at least one semiconductor processing etchant are present in said composition as supercritical fluids.

Yet another aspect of the invention relates to a cleaning composition, comprising supercritical $CO_2$, isopropanol, and ammonium fluoride.

A still further aspect of the invention relates to a method of cleaning a semiconductor substrate to remove unwanted material therefrom, said method comprising contacting the semiconductor substrate with a cleaning composition comprising supercritical $CO_2$, isopropanol, and ammonium fluoride.

Other aspects, features and embodiments of the invention will be more fully apparent from the ensuing disclosure and appended claims.

DETAILED DESCRIPTION OF THE INVENTION AND PREFERRED EMBODIMENTS THEREOF

Supercritical fluids are formed under conditions at which the density of the liquid phase equals the density of the gaseous phase of the substance. For example, carbon dioxide ($CO_2$), which is a gas at standard temperature and pressure, undergoes a transition from liquid to SCF above a critical point, corresponding to $T_c \geq 31.1°$ C. and $p_c \geq 72.8$ atm. Once formed, the density of the SCF can be varied from liquid-like to gaseous-like, yielding different solvation abilities, by varying the pressure and temperature. Supercritical fluids have a density/solubility and diffusibility approaching that of the liquid and gaseous phase, respectively. Additionally, the surface tension of SCFs is negligible.

Because of its readily manufactured character, ability to be recycled, lack of toxicity and negligible environmental effects, supercritical $CO_2$ is a preferred SCF in the broad practice of the present invention, although the invention may be practiced with any suitable SCF species, with the choice of a particular SCF depending on the specific application involved.

The present invention relates to supercritical fluid-based cleaning compositions for removal of unwanted material from semiconductor wafers. In specific embodiments, the cleaning compositions include at least one of (I) co-solvent (s), (II) surfactant(s), (III) chelating agent(s), and (IV) chemical reactant(s).

For example, pure SCF, such as supercritical $CO_2$ may be effective in some applications without any additional components, e.g., where the unwanted material on the semiconductor substrate is soluble in or otherwise completely removed by the supercritical $CO_2$. In other applications, the SCF may not be an effective solvent for the removal of the unwanted material from the semiconductor substrate. In such case, the addition of appropriate co-solvent(s) may be employed to increase the solubility and removability of the photoresist material and residue in the SCF.

Alternatively, SCFs in combination with other components, such as surfactants, chelating agents and/or chemical reactants such as acids/bases or oxidants/reductants are contemplated in the practice of the invention to effect material removal. The use of additional components in the SCF-based formulation can be exploited to enhance the cleaning action of the composition, e.g., by manipulating the critical temperature of the mixture, or by introducing polar or nonpolar constituents to the formulation in order to enhance the interactions of the cleaning formulation with a specific compound or material sought to be removed from the semiconductor substrate.

Due to the progressively smaller dimensions of semiconductor patterns, the SCF-based cleaning formulations of the invention provide a distinct advantage in penetrating small geometry structures such as vias and trenches on the semiconductor wafer, particularly in instances in which the wettability of the semiconductor substrate is low. This same feature allows the removal of $H_2O$ from aqueous developed photoresists of <0.09 μm characteristic dimension, without image collapse or degradation.

The cleaning formulations of the invention thus may be variously formulated with SCF(s), co-solvent(s), active agent(s), surfactant(s) and chelating agent(s).

In one aspect, the cleaning composition comprises an SCF, a co-solvent, and an active agent, for removal of unexposed photoresist, metal oxides, CMP residues, etc. Surface metal oxides pose a particular problem in semiconductor manufacturing electrodeposition operations, in that they can prevent proper nucleation of electroplated deposits and interfere with electrical conductivity.

In another aspect, the cleaning composition comprises an SCF, a co-solvent, an active agent, surfactant(s) and/or chelating agent(s), as necessary or desirable for removal of specific unwanted material on the semiconductor substrate.

Examples of SCF species useful in the broad practice of the invention include, but are not limited to, carbon dioxide, oxygen, argon, krypton, xenon, or ammonia.

An "active agent" as used herein is a material that induces chemical reaction, either in the cleaning composition as a reaction mixture, or at the surface of the semiconductor wafer, to enhance the cleaning and/or removal action of the formulation, relative to a corresponding formulation lacking such material.

Examples of active agents include, without limitation, acids, bases, reducing agents and oxidizing agents. Illustrative active agents include HF sources (e.g., HF, triethylamine trihydrogen fluoride, hydrogen fluoride-pyridine, etc.), fluoride sources (e.g., of the formula $R_4NF$, wherein each R is independently selected from H, alkyl, aryl, etc., wherein alkyl is preferably $C_1$-$C_8$ alkyl and aryl is preferably $C_6$-$C_{12}$ aryl) perfluorocarboxylic acids, alkyl sulfonic acids, aryl sulfonic acids, alkyl amines, ozone, dinitrogen oxide, potassium permanganate, and hydrogen.

Preferably, the active agent is an acid or a reducing agent. When a reducing agent is solubilized in the SCF, the reducing agent may require activation, e.g., by an activation process involving thermal, optical, and/or sonic activation.

Co-solvent species useful in the cleaning formulations of the invention may be of any suitable type. Illustrative species, include, but are not limited to, methanol, ethanol, and higher alcohols, N-alkylpyrrolidones, such as N-methyl-, N-octyl-, or N-phenylpyrrolidones, dimethylsulfoxide, sulfolane, catechol, ethyl lactate, acetone, butyl carbitol, monoethanolamine, butyrol lactone, diglycol amine, alkyl ammonium fluoride, γ-butyrolactone, butylene carbonate, ethylene carbonate, and propylene carbonate.

Surfactants useful in the cleaning formulations of the present invention may likewise be of any suitable type, including anionic, neutral, cationic, and zwitterionic types. Illustrative surfactant species include, without limitation, acetylenic alcohols and diols, and long alkyl chain secondary and tertiary amines.

Chelating agents useful in the cleaning formulations of the invention may be of any suitable type, including, for example, polycarboxylic acids such as iminodiacetic acid and lauryl ethylenediamine triacetic acid, β-diketones such as: 2,4-pentanedione; 1,1,1trifluoro-2,4-pentanedione; and 1,1,5,5,5-hexafluoro-2,4-pentanedione, substituted dithiocarbamates, malonic acid esters, and polyethylene glycols.

Illustrative species of acids useful in the cleaning formulations of the invention include, without limitation, perfluorocarboxylic acids, and alkyl or aryl sulfonic acids. Illustrative species of bases useful in the cleaning formulations of the invention include, but are not limited to, amines, such as alkyl amines. Oxidizing agents useful in the broad practice of the invention include, without limitation, oxygen, ozone and nitrous oxide.

Reducing agents usefully employed in the cleaning formulations of the invention include, without limitation, hydrogen, ammonia, silanes, hydrides and metal hydrides.

The components of (I) co-solvent(s), (II) surfactant(s), (III) chelating agent(s), and (IV) chemical reactant(s), when present in the SCF-based cleaning formulations of the present invention, may be present at any suitable concentrations and relative proportions, as appropriate to the use of the formulation in removing unwanted material from a substrate surface having such unwanted material deposited thereon.

For example, the components (I)-(IV) may be present at concentrations of from about 0.1% by weight to about 50% by weight, when present in the formulation, or alternatively in concentration ranges having minima such as 0.2%, 0.5%, 1% and 5%, and maxima such as 25%, 20%, 18%, 15%, 12% and 10%, in any permutative combinations thereof.

Further, the cleaning formulations of the invention may selectively comprise, consist of, or consist essentially of, any of the SCF and optionally additional components of the formulation disclosed herein. The weight percentage concentrations of components of the cleaning formulation as referred to herein, are based on the total weight of the formulation, including the SCF(s) and all other components.

Another aspect of the invention relates to using traditional etching gases, such as, for example, sulfur hexafluoride ($SF_6$), carbon tetrafluoride ($CF_4$) and xenon difluoride ($XeF_2$), in a supercritical form to achieve higher etch rates than are achievable by conventional etch processes, and also to avoid the need for plasmas to activate the etching species. To stimulate the etch reaction using such supercritical etching gases, thermal activation or radiation can be used. The SCF, e.g., $SF_6$ or $CF_4$, can be used neat or in combination with other SCFs. Additionally, co-solvent(s), surfactant(s), chelating agent(s), and/or active agent(s) can be added to the supercritical etchant cleaning formulation.

Another aspect of the present invention relates to a method for fabricating a semiconductor wafer, in which photoresist, CMP residues and/or metal oxide substances are removed from the semiconductor wafer using an SCF-containing cleaning formulation, e.g., a cleaning formulation comprising a mixture of at least one supercritical fluid, at least one co-solvent, and at least one additional active agent.

The methods and cleaning formulations of this invention are advantageous for removing unwanted substrate materials, such as photoresists, metal oxides and CMP residues. Due to the high wetting character of the SCF, which allows it to penetrate small and complex geometries on the semiconductor wafer, the SCF is able to effect a high rate and extent of cleaning of the semiconductor substrate. Additionally, smaller quantities of toxic reagents are needed and more substantial cleaning of the substrate surface is achieved by the SCF-based cleaning formulations of the invention, relative to the procedures and compositions heretofore conventionally used in the art.

As a specific example, a semiconductor wafer in a semiconductor device manufacturing facility may be subjected to initial masking and photoresist radiation exposure, following which the semiconductor wafer is loaded and sealed in a process vessel. The process vessel is purged with a process gas that corresponds to the SCF gas but is at a non-supercritical condition, to displace all other gases in the vessel. In a specific embodiment, the process gas is $CO_2$, and the corresponding SCF used in the process is supercritical $CO_2$. Typically, when $CO_2$ is used, the gaseous pressure of the $CO_2$ purge gas does not exceed about 2 atm. After purging, the vessel is heated to a temperature $T_o > T_c$ and is pressurized to a pressure $p_o > p_c$ with preheated $CO_2$. The desired pressure, $p_o$, and temperature, $T_o$, are dependent on the wafers to be cleaned, the chemical formulation and process parameters, the material to be removed from the wafer, and the process equipment that is employed. Once $p_o$ and $T_o$ are attained, the process vessel is charged with supercritical $CO_2$.

The semiconductor wafer cleaning formulation may comprise such $CO_2$ alone, or more preferably a mixture of supercritical fluid $CO_2$, a co-solvent, and at least one additional active agent. The semiconductor wafer cleaning formulation is introduced to the vessel to remove unwanted material, e.g., photoresist, from the wafer. The cleaning operation is continued for sufficient time to effect substantially complete removal of the unwanted material from the wafer surfaces.

The contacting of the semiconductor wafer with the SCF-based semiconductor wafer cleaning formulation, or "soaking" of the wafer in the cleaning formulation, is carried out for a suitable period of time, which in a specific embodiment can for example be on the order of from about 20 to about 60 seconds, although other (longer or shorter) periods of contacting may be usefully employed depending on the nature and amount of the material to be removed from the semiconductor wafer, and the process conditions employed for wafer cleaning.

During the contacting with the wafer, the semiconductor wafer cleaning formulation at high pressure infuses into the unwanted surface material, e.g., photoresist, to cause swelling of the surface and weakening of the interface bonds. The semiconductor wafer cleaning formulation thus may be formulated to dissolve specific fluorinated compounds, metal oxides, or other coatings, layers or residues, to effect their removal from the substrate. Thus, for example, a reducing agent may be incorporated in the semiconductor wafer cleaning formulation, and activated during the wafer contacting step by suitable (e.g., thermal, optical, and/or sonic) activation techniques.

Following soaking of the wafer in the semiconductor wafer cleaning formulation, the vessel containing the wafer is rapidly decompressed while maintaining the process fluid in the vessel in a supercritical state. During decompression, the unwanted material on the substrate, which was weakened in the soaking step, is subjected to a sudden pressure differential to cause such unwanted material to break away from the substrate. The unwanted material components that are solubilized in the semiconductor wafer cleaning formulation in the higher pressure soaking step may drop out of solution in the lower pressure decompressed state and be readily collected for disposal, or such components may remain in solution and be readily removed from the pressure vessel by exhausting the unwanted material-containing semiconductor wafer cleaning formulation from the pressure vessel.

The above-mentioned decompression step may be conducted for any suitable period of time, e.g., on the order of 20 seconds, although longer or shorter times may be desirable depending on the character of the material to be removed from the semiconductor wafer surfaces and the specifics of the process. If necessary, repeated cycles of soaking and decompression may be utilized to achieve substantially complete removal of the unwanted material from the semiconductor wafer.

Following removal of the unwanted material, the wafer is rinsed with pure supercritical $CO_2$ for a suitable period of time, e.g., for 30 seconds. Thereafter, the vessel is dried so that the wafer can be removed. This is effected by maintaining the vessel temperature at $T_o > T_c$ and decreasing the pressure as $T_o$ remains constant. The supercritical $CO_2$ under such conditions will transform directly into the gaseous phase without entering the liquid phase, thereby eliminating the risk of residual liquid droplet stains on the wafer.

The cleaning process of the invention can be practiced with variable pressure processing, or alternatively it can be carried out at constant or substantially constant pressure, with the residue on the substrate reacting and dissolving in the SCF solution, and not just physically peeling from the surface of the substrate.

In another aspect of the invention, etching gases such as sulfur hexafluoride, carbon tetrafluoride or xenon difluoride are utilized in a supercritical state for enhancement of etching to effect material removal, e.g., of photoresist, metal oxides, CMP residue, etc., from the semiconductor substrate.

In yet another variant aspect of the invention, supercritical $SF_6$ and/or supercritical $CF_4$ can be mixed with supercritical $CO_2$, optionally with co-solvent(s) and the aforementioned active agents, analogous to the previously described semiconductor wafer cleaning formulations of the invention.

The etching gases utilized in such SCF-based cleaning formulations may be activated during the substrate contacting step by conventional activation techniques, such as thermal, optical and/or sonic activation techniques.

According to yet another embodiment of the invention, a supercritical fluid can be driven into the unwanted material film on the semiconductor substrate during an initial contacting step, followed by application of heat to the SCF-penetrated substrate film to effect expansion of the SCF, e.g., $CO_2$, and resultant lift-off of the unwanted material film from the substrate. The contacting conditions are appropriately selected to uniformly distribute the SCF over the substrate surface, so that the SCF is substantially homogeneously dissolved in the film.

Upon application of heat, rapid expansion of the SCF, e.g., $CO_2$, occurs, causing disruption, degradation and decomposition of the unwanted material, e.g., photoresist, film. The SCF contacting and heating steps may be repetitively carried out as necessary to effect removal of any residual unwanted material on the semiconductor substrate. Alternatively, wet cleaning agents may be applied to the SCF-treated surface to complete the removal of residual material, or such wet cleaning treatment may be followed by renewed SCF treatment. It will be appreciated that such use of SCF may be combined with other unwanted material removal agents and approaches, as necessary or desirable in a given application to yield substantially complete removal of the unwanted material from the semiconductor substrate.

The present invention broadly contemplates the enhancement of currently employed semiconductor wafer etchant materials by use of SCF at the etching locus, to facilitate transport of the etchant into fine feature areas of the semiconductor substrate. Such augmentation of the etching technique enables effective pattern definition, e.g., of high aspect ratio vias and trenches, to be achieved. Such use of SCF agents in combination with established etching agents also overcomes issues associated with low etch rates, and thereby enables etchants to be used, which would otherwise be of low or marginal utility due to their inadequate permeation or penetration into the material layer or residue on the substrate surface.

Further, the invention contemplates the use of traditional etching agents such as $SF_6$, $CF_4$, etc. in supercritical form themselves, e.g., in a neat SCF form, or in combination with other SCF agents, such as $CO_2$, etc., to achieve etching rates and extent of removal of unwanted substrate material, which are substantially in excess of those achievable by conventional processes, and without the need for plasma activation of the etchant.

Etchant compositions in accordance with the invention encompass formulations including the use of chelating agents dissolved in the supercritical fluid. Thermal activation and other activation modalities can be employed to stimulate the etching reaction, e.g., UV light exposure and/or laser energy impingement on the etch site. These optical activation methods may be employed in any suitable manner, such as by flood exposure through a mask, or by projection onto a surface to effect non-contact selective etching.

The invention also contemplates pulsed operation in such etch applications, where the activating radiation is pulsed for high-efficiency etching action with a high degree of control, in relation to conventional dip/spray wet etching techniques.

The invention also contemplates use of SCF-based compositions to modify surface charge of a substrate to assist removal of unwanted material thereon, or to effect a protective action on the substrate. Thus, SCF-based compositions containing materials capable of binding to the substrate surface, or to selected surface regions thereof, can be employed to change the chemical properties of the surface, or to protect the underlying material or structure. The modifying components of the composition may be any suitable type, as for example high molecular weight materials having relatively low volatility (which low volatility characteristic renders such high molecular weight materials difficult or even impossible to transport by conventional deposition methods such as chemical vapor deposition).

By use of supercritical fluids, such modifying materials can be readily solubilized, transported efficiently to the substrate to be modified, and contacted with the substrate. Thereafter, the substrate can be rapidly dried and subsequently processed in the same process chamber, e.g., by cleaning processes, deposition processes, etc.

When the surface modification is employed to effect protective action on the substrate surface or a selected region thereof, the protected surface (as modified by the modifying agent) can subsequently be returned to its original state, such as by contacting of the substrate with another SCF-based composition containing a cleaning component, and/or by ordinary liquid phase cleaning chemistry after removal of the substrate element from the process chamber.

Such methodology permits the delivery of different materials, e.g., modifying/protective materials, other deposited materials, cleaning agents, etc., to the substrate using the same process equipment, thereby facilitating high throughput processing in the semiconductor manufacturing facility.

In a specific embodiment, long-chain materials constitute the modifying component. Such long-chain modifying components include, without limitation, long-chain organothiols, long-chain acetates and long-chain amines. Such long-chain organic materials can be bound to selected surface regions on the substrate to vary surface chemical properties, and/or to protect the contacted region of the substrate for subsequent processing. Long-chain materials can be applied to the substrate surface in specific embodiments for reversible sorption on the surface, such sorbed material being stable in subsequent processing steps, or alternatively, conferring on the coated substrate an enhanced cleanability, as appropriate to the specific application. Thus, a substrate surface may be modified to render it more highly susceptible to cleaning, in subsequent interaction with cleaning compositions, e.g., SCF-based compositions, conventional wet cleaning agents, and the like.

As used herein, the term "long-chain" in reference to organic materials used for surface modification or surface protection, means a chain having at least eight atoms therein, e.g., from eight to forty atoms. In specific embodiments, the long-chain molecules may comprise $C_8$-$C_{40}$ chains, $C_8$-$C_{30}$, or other carbon number ranges appropriate to the specific substrate and surface modification/surface protection function to be effected by the long-chain agent.

Substrates in the practice of the invention may be formed of any suitable material of construction. Illustrative substrate materials include, without limitation, silicon, sapphire, gallium arsenide, gallium nitride, silicon on insulator (SOI), and silicon carbide.

More generally, the present invention is susceptible of use in a wide variety of applications. By way of further specific example, SCF-assisted etching in accordance with the present invention may be utilized for cleaning of recording head sides of printed circuit boards (PCBs). Thus, SCF-based etching compositions and techniques of the invention may be employed for removal of surface oxides from copper surfaces prior to the plating of the recording head. The removal of surface oxides is necessary in such applications, since unremoved surface oxide deposits prevent good nucleation of electroplated deposits and interfere with electrical conductivity of the recording head.

A cleaning formulation can be made up by dissolving an appropriate acid medium in a supercritical fluid, and then dispensing same onto the contact surface of the PCB substrate. The wetting ability imparted by the supercritical fluid to the cleaning formulation obviates or at least minimizes the need for surfactant(s) in the cleaning formulation.

In another embodiment, hydrogen or other reductive species are dissolved in a supercritical fluid and activated at the surface to be cleaned. The activation may be effected in any suitable manner, e.g., thermally, optically or by means of sound waves (e.g., ultrasonically or megasonically), to reduce surface copper oxides and facilitate their removal from the PCB surface.

The invention may be carried out in a pulsed process wherein the cleaning medium includes the supercritical solvent, optionally with an etchant component or reductive agent. In such pulsed process, the cleaning medium is alternatingly and repetitively energized by thermal, optical and/or sonic means to effect the cleaning of the substrate.

The present invention is broadly applicable to integrated circuit (IC) manufacture, for cleaning operations between successive process steps to remove organic and/or inorganic residues that are present, such as photoresist or post-etch photoresist products.

By the provision of a supercritical fluid-based cleaning composition including at least one of (I) co-solvent(s), (II) surfactant(s), (III) chelating agent(s), and (IV) chemical reactant(s), the cleaning compositions and corresponding cleaning methods of the present invention facilitate removal of unwanted material in applications where low solubility and low wettability of the material to be removed would otherwise not be satisfactorily addressed by the SCF alone or by various combinations of (I)-(IV) without such SCF component.

Thus, the SCF-based cleaning compositions of the present invention permit effective cleaning of small size structures of semiconductor substrates, and have the further advantage that they eliminate the need for large quantities of liquid aqueous and organic reagents such as are used in conventional cleaning operations. As a result, the large volume waste streams from the semiconductor manufacturing facility that are generated by prior art cleaning techniques are avoided.

In the practice of the present invention, after the cleaning operation has been concluded, the (I) co-solvent(s), (II) surfactant(s), (III) chelating agent(s), and (IV) chemical reactant(s) are readily separated from the cleaning formulation due to the large difference in vapor pressure between the SCF and the other component(s) (I)-(IV).

The features and advantages of the invention are more fully apparent from the following example.

EXAMPLE

Post ash photoresist residue was removed from the surface of patterned structures by the following process. A cleaning composition, including alcohol (e.g., methanol, ethanol, isopropanol) co-solvent in supercritical $CO_2$ and a fluorinated agent, was added to a cleaning vessel and allowed to equilibrate at 4000 psi at 90° C. (1% w/v fluoride, 15% w/v alcohol). The cleaning fluid composition was circulated through the cleaning vessel at a constant pressure and temperature for a predetermined period of time (30-900 seconds). Upon completion, the cleaning composition was displaced with pure supercritical $CO_2$ and the cleaning vessel was rinsed with three volumes amount of supercritical $CO_2$ in order to completely remove the cleaning composition from the wafer surface.

In general, cleaning formulations of such type were found to be highly effective in compositions including (i) the supercritical fluid $CO_2$, (ii) isopropanol in an amount of from about 0.005 wt. % to about 20 wt. %, based on the weight of the composition, and (iii) ammonium fluoride in an amount of from about 0.005 wt. % to about 5.0 wt. %, based on the weight of the composition, when such formulations were utilized for cleaning contact with the substrate for a time period of from about 30 to about 900 seconds, at suitable temperature, e.g., on the order of about 90° C.

It will be appreciated that the compositions and cleaning and etch removal methods of the invention may be practiced in a widely variant manner, consistent with the broad disclosure herein. Accordingly, while the invention has been described herein with reference to specific features, aspects, and embodiments, it will be recognized that the invention is not thus limited, but is susceptible of implementation in other variations, modifications and embodiments.

Accordingly, the invention is intended to be broadly construed to encompass all such other variations, modifications and embodiments, as being within the scope of the invention hereinafter claimed.

What is claimed is:

1. A method of surface treatment of a substrate to produce a modified surface amenable to further processing, said method comprising contacting the substrate surface with a modifying composition to modify the surface charge of a substrate or effectuate a protective action on said substrate surface, wherein said composition comprises a supercritical fluid (SCF) and at least one long-chain organic material, wherein said long-chain organic material comprises an organic component selected from the group consisting of long-chain organothiols, or long-chain acetates.

2. The method of claim 1, wherein the substrate comprises a semiconductor substrate.

3. The method of claim 1, wherein the SCF component comprises supercritical $CO_2$.

4. A surface modification composition comprising a supercritical fluid (SCF) and a long-chain organic material, wherein said long-chain organic material is in an amount sufficient to bind to a substrate surface and modify the surface charge of the substrate surface or effectuate a protective action on said substrate surface, wherein said long-chain organic material comprises an organic component selected from the group consisting of long-chain organothiols, or long-chain acetates.

5. The composition of claim 4, wherein said substrate comprises a semiconductor substrate.

6. The composition of claim 4, wherein the long-chain organic material comprises a chain having about eight to about forty carbon atoms.

7. The composition of claim 4, wherein the long-chain organic material binds to the substrate surface.

8. The method of claim 1, wherein the long-chain organic material comprises a chain having about eight to about forty carbon atoms.

9. The method of claim 1, further comprising drying the substrate surface for subsequent processing.

10. The method of claim 9, wherein the subsequent processing comprises processes selected from the group consisting of cleaning processes and deposition processes.

11. The method of claim 1, wherein the surface treatment of the substrate surface is reversible.

12. The method of claim 1, wherein the modified surface is more highly susceptible to cleaning.

13. The method of claim 2, wherein the semiconductor substrate comprises a material selected from the group consisting of silicon, sapphire, gallium arsenide, gallium nitride, silicon on insulator (SOI), and silicon carbide.

14. The composition of claim 5, wherein said semiconductor substrate comprises a material selected from the group consisting of silicon, sapphire, gallium arsenide, gallium nitride, silicon-on-insulator, and silicon carbide.

15. The composition of claim 4, wherein the SCF component comprises supercritical $CO_2$.

* * * * *